(12) United States Patent
Davies

(10) Patent No.: US 6,617,686 B2
(45) Date of Patent: Sep. 9, 2003

(54) SEMICONDUCTOR DEVICE AND METHOD OF ISOLATING CIRCUIT REGIONS

(76) Inventor: Robert B. Davies, 433 E. McKinley St., Tempe, AZ (US) 85281-1026

( * ) Notice: Subject to any disclaimer, the term of this patent is extended or adjusted under 35 U.S.C. 154(b) by 0 days.

(21) Appl. No.: 10/072,775

(22) Filed: Feb. 8, 2002

(65) Prior Publication Data

US 2003/0151122 A1 Aug. 14, 2003

(51) Int. Cl.[7] .......................... H01L 23/34; H01L 29/00; H01L 21/44
(52) U.S. Cl. .......................... 257/725; 257/499; 438/106
(58) Field of Search .................................. 438/106, 455, 438/456, 110; 257/678, 685, 778, 787, 499, 684, 686, 723, 725; 174/35 R, 52.3, 52.4, 253

(56) References Cited

U.S. PATENT DOCUMENTS

| | | | | |
|---|---|---|---|---|
| 5,369,552 A | * | 11/1994 | Barnes et al. ............... | 361/816 |
| 5,418,329 A | * | 5/1995 | Katoh et al. ................ | 174/52.3 |
| 5,504,659 A | * | 4/1996 | Acatay et al. ............... | 361/816 |
| 5,825,092 A | * | 10/1998 | Delgado et al. ............. | 257/778 |
| 6,178,318 B1 | * | 1/2001 | Holmberg et al. ........... | 455/300 |
| 6,180,876 B1 | * | 1/2001 | Holmes ..................... | 174/35 R |
| 6,410,847 B1 | * | 6/2002 | Allen et al. ................. | 174/35 |

* cited by examiner

Primary Examiner—Vinh P. Nguyen
Assistant Examiner—Scott B. Geyer
(74) Attorney, Agent, or Firm—Parsons & Goltry; Robert A. Parsons; Michael W. Goltry

(57) ABSTRACT

A semiconductor device (10) includes a semiconductor die (14) having first and second circuit regions (30, 32) formed on a first surface (24). The semiconductor die is housed in a semiconductor package (20) whose lid (40) is formed with a projection (67) that electrically contacts the first surface of the semiconductor die to shield the first circuit region from the second circuit region. Also, inactive components, such as a capacitor can be formed in lid (40).

31 Claims, 6 Drawing Sheets

SEMICONDUCTOR DEVICE AND METHOD OF ISOLATING CIRCUIT REGIONS

FIELD OF THE INVENTION

The present invention relates in general to semiconductor devices and, more particularly, to semiconductor packages for housing high frequency integrated circuits to electrically isolate a region of a semiconductor die.

BACKGROUND OF THE INVENTION

Many electronic systems include semiconductor devices whose circuit components generate signals that radiate toward other system components. For example, wireless communication systems typically include integrated high frequency power amplifiers whose output stages operate at high frequencies and high power levels and consequently produce high amplitude radiating signals. If these radiating signals propagate to more sensitive system circuitry such as a low noise amplifier stage, an unexpected feedback path can arise which produces spurious signals and/or oscillations that degrade the performance of the system.

Previous systems avoid such feedback paths by housing different circuits in separate semiconductor packages to isolate the sensitive circuitry from the radiating signals. In some systems, the separate packages are individually shielded, which increases the fabrication cost of the system. In other systems, the separate packages are located a distance apart so that the radiated signal is attenuated before it propagates to a sensitive stage. However, maintaining such a distance between integrated circuits increases the physical size as well as the fabrication cost of the system.

Hence, there is a need for a semiconductor package and method that can electrically isolate a radiating signal generated in one portion of an integrated circuit from other, more sensitive portions of the integrated circuit in order to reduce the size and fabrication cost of a system.

It would be highly advantageous, therefore, to remedy the foregoing and other deficiencies inherent in the prior art.

Accordingly, it is an object of the present invention to provide a new and improved semiconductor package.

Another object of the present invention is to provide a system and method for providing a new and improved semiconductor package constructed to isolate integrated circuits or portions of integrated circuits within the package.

SUMMARY OF THE INVENTION

Briefly, to achieve the desired objects of the present invention in accordance with a preferred embodiment thereof, provided is a semiconductor device, including a semiconductor die having first and second circuit regions formed on a first surface and a semiconductor package for housing the semiconductor die, where a lid of the semiconductor package is formed with a projection for electrically shielding the first circuit region from the second circuit region.

To further achieve the desired objects of the present invention, a method of electrically isolating a region of a semiconductor die includes providing a semiconductor package for housing the semiconductor die, generating a radiating signal with a circuit component of the semiconductor die, and shielding the radiating signal with a projection formed in a lid of the semiconductor package.

BRIEF DESCRIPTION OF THE DRAWINGS

The foregoing and further and more specific objects and advantages of the invention will become readily apparent to those skilled in the art from the following detailed description of a preferred embodiment thereof, taken in conjunction with the drawings in which.

DETAILED DESCRIPTION OF THE DRAWINGS

Figure 1:
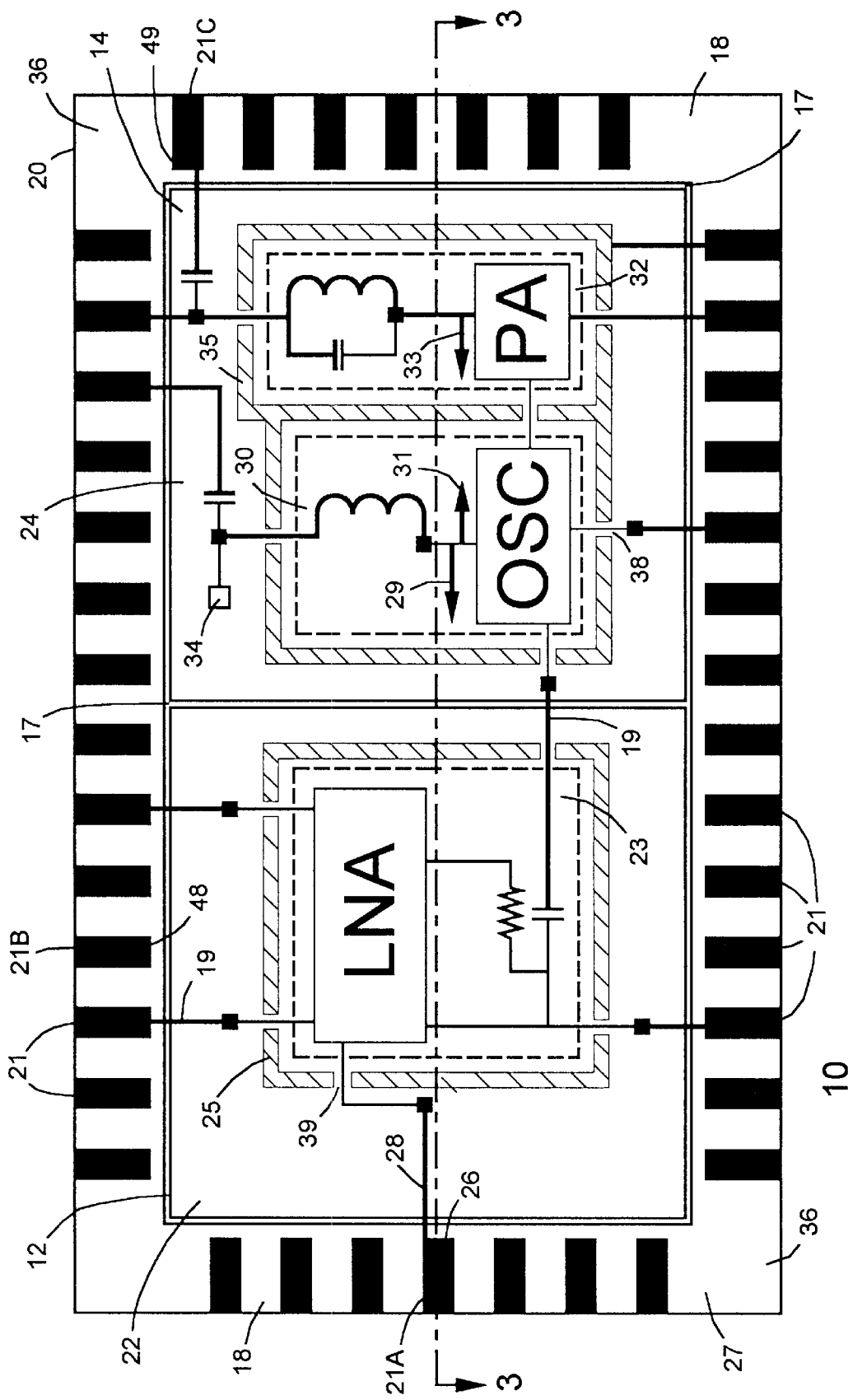
FIG. 1 shows a top view of an integrated circuit after a first fabrication step.

Turning now to the drawings in which like reference characters indicate corresponding elements throughout the several views, attention is directed to FIG. 1 which illustrates a top view of an integrated circuit 10. Circuit 10 includes semiconductor dice 12 and 14 mounted on a package base 18 of an integrated circuit package 20. A filler layer 17 is formed in integrated circuit package 20 to provide a surface between semiconductor dice 12 and 14 that is substantially coplanar with a surface 22 of semiconductor die 12, a surface 24 of semiconductor die 14 and a perimeter surface 27 of package base 18. Filler layer 17 comprises a standard integrated circuit dielectric material such as polyimide which facilitates the formation of planar electrical connections between semiconductor dice 12 and 14 such as a interconnect trace 19. In one embodiment, integrated circuit 10 is formed as a wireless communication device such as a cellular telephone or a two way pager operating at a frequency greater than eighteen hundred megahertz. In one embodiment, integrated circuit 10 operates from a battery (not shown) operating at a voltage of about three volts.

Semiconductor die 12 includes a low noise amplifier (LNA) formed in a circuit region 23 for receiving and amplifying external signals operating at amplitudes between 0.1 microvolts and 10 microvolts. Circuit region 23 is substantially surrounded by a contact region 25 comprising a conductive material such as a top-level standard integrated circuit metallization trace on surface 22.

Semiconductor die 14 includes an oscillator (OSC) formed in a circuit region 30 and a power amplifier (PA) formed in a circuit region 32. Circuit region 30 includes a planar inductor that sets the operating frequency of the oscillator to produce an alternating current (AC) oscillating signal $V_1$ typically operating at a frequency of about one gigahertz or greater. Oscillating signal $V_1$ radiates in a substantially omnidirectional fashion, including component rays 29 and 31 which propagate toward circuit regions 23 and 32, respectively, as shown.

The power amplifier circuitry of circuit region 32 includes an output stage which produces an AC output signal $V_2$ at a power level of at least 10 milliwatts for transmitting to an external base station. Output signal $V_2$ typically operates at a frequency greater than about 1800 megahertz. Circuit region 32 typically includes a planar inductor and/or other passive components whose function is to provide an impedance match to an external antenna (not shown). The high power and current levels generated in circuit region 32 result in output signal $V_2$ propagating omnidirectionally, including a ray 33 that propagates toward circuit regions 30 and 23.

A contact region 34 is formed on surface 24 with a conductive material such as a standard integrated circuit metallization trace to function as an internal reference node of semiconductor die 14. A contact region 35 is formed on surface 24 in the same processing steps used to form contact region 34. Contact region 35 is formed to respectively substantially surround circuit regions 30 and 32 as shown. Also, small gaps 39 and 38 are provided during the formation of contact regions 25 and 35, respectively, to allow for leads (e.g., 19 and 28) to extend from circuitry on dice 12 and 14 to one or more of leads 21 and between circuits (e.g., between the OSC and the PA).

Package base 18 includes a perimeter ring 36 on which are formed a plurality of leads 21 on perimeter surface 27 for electrically contacting to external system components. In one embodiment, perimeter ring 36 is formed with a dielectric material such as a nonconductive ceramic material. A contact region 26 is formed on a lead 21A and coupled to components in circuit region 23 (through a gap 29 in contact region 25) with a trace 28 formed with a conductive material similar to that used to form contact regions 25 and 34–35. A contact region 48 is formed on a lead 21B to operate as a connection to a DC source, as will be explained in more detail below. A contact region 49 is formed on a lead 21C in a similar fashion. Note that traces 19 and 28 cross filler layer 17 in a substantially coplanar fashion which allows traces 19 and 28 to be formed by electroplating or by a functionally equivalent processing step along with contact regions 25–26, 34–35, 48, and 49. Such processing avoids the need for a costly wire bond step, increases the reliability of integrated circuit 10 and results in a lower profile package.

Figure 2:
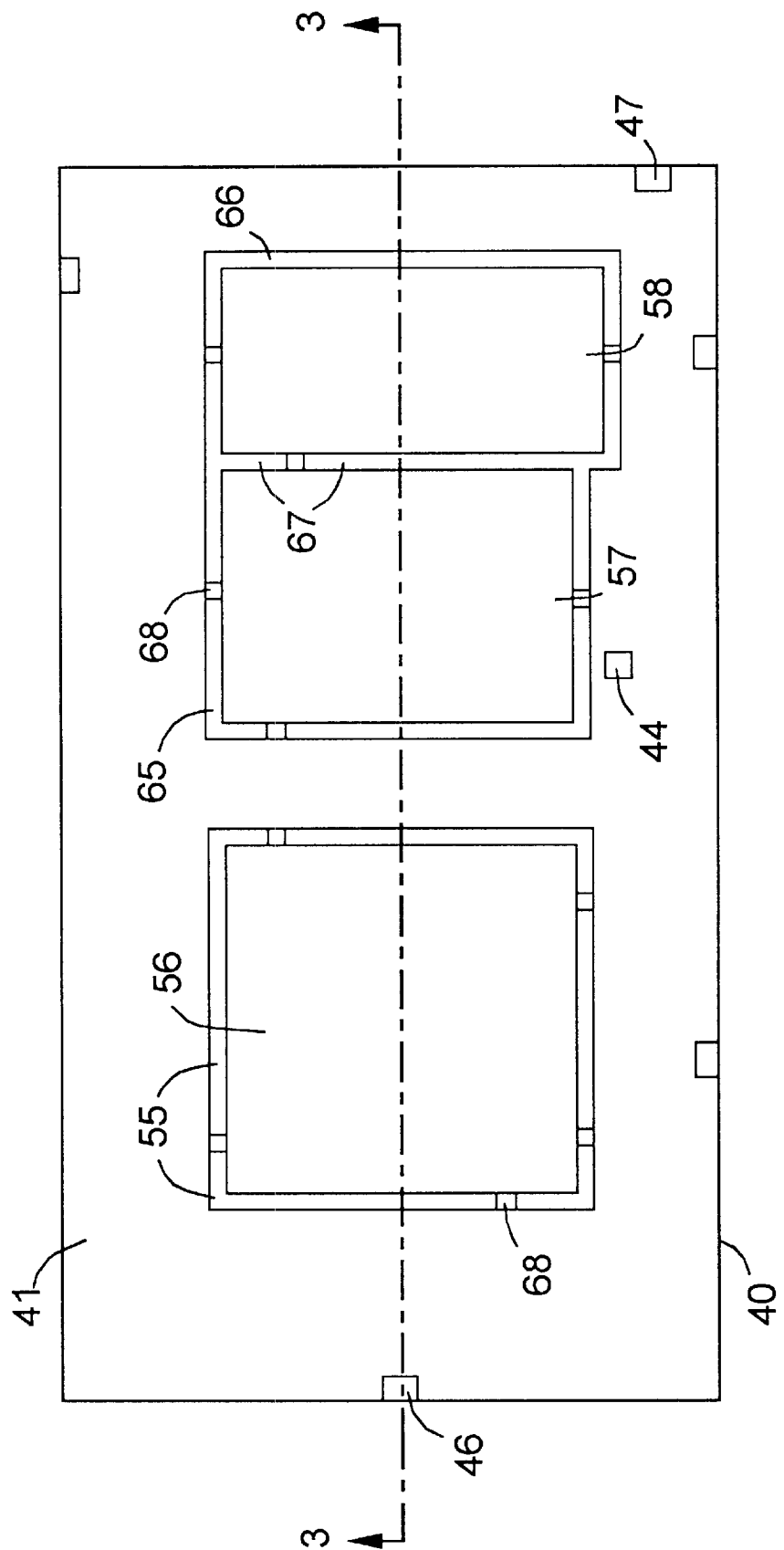
FIG. 2 shows a bottom view of a lid of a semiconductor package.

Turning now to FIG. 2, a top view of a package lid 40 of integrated circuit 10 is illustrated. Package lid 40 has a first surface 41 that faces surfaces 22 and 24 of semiconductor dice 12 and 14 when package lid 40 is attached to package base 18 during assembly.

Projections 44, 46 and 47 protrude from surface 41 for electrically and/or mechanically attaching to contact regions 34, 26 and 49, respectively. In a similar fashion, projection 55 extends from surface 41 for attaching to contact region 25 and projections 65–67 are formed to extend from surface 41 for attaching to contact region 35. Projections 55 and 65–67 are respectively arranged on surface 41 so as to substantially enclose or surround circuit regions 23, 30 and 32 after assembly. Projections 55 and 65–67 generally include small notches or gaps 68 which are positioned to align with gaps 29 and 39 in contact regions 25 and 35, respectively, to allow for leads to extend to one or more leads 21 and between circuits without contacting any of projections 55 and 65–67. In some embodiments, notches or gaps 68 may not be included because gaps 29 and 39 provide sufficient space (e.g. depth). Projections 55 and 65–67 define or enclose interior surfaces 56–58 in package lid 40. At least interior surfaces 56–58 of surface 41 are formed of, or coated with, an electrically conductive or shielding material. Note that projections 65–67 are contiguous, with the common portion of projections 65 and 66 lying between interior surfaces 57 and 58 and being referred to as projection 67. Projections 65–67 combine with interior surfaces 57 and 58 which may be coplanar with surface 41, thereby forming reflecting shields that prevent rays 29, 31 and 33 from propagating to circuit region 23 or other external circuitry, as described below.

Projections 44, 46–47, 55 and 65–67 may be formed on package lid 40 using any of a variety of standard manufacturing methods, such as plating, casting, or milling. In one embodiment, package lid 40 is formed with a conductive material such as copper of a thickness adequate to provide a low resistance so that contact regions 25, 26, 34, 35 and 49 of integrated circuit 10 operate at substantially the same potential, e.g., ground potential. Alternatively, package lid 40 may be formed or plated with another conductive material suitable for attaching to the standard integrated circuit interconnect traces of contact regions 25–26, 34–35 and 49. In one embodiment, projections 44, 46, 47, 55 and 65–67 extend a it distance of about two hundred fifty micrometers from surface 41. Where electrical connection is not necessary, package lid 40 may be formed with a nonconductive material preferably having a high permeability and/or permittivity in order to reflect rays 29, 31 and 33 to contain their propagation.

Figure 3:
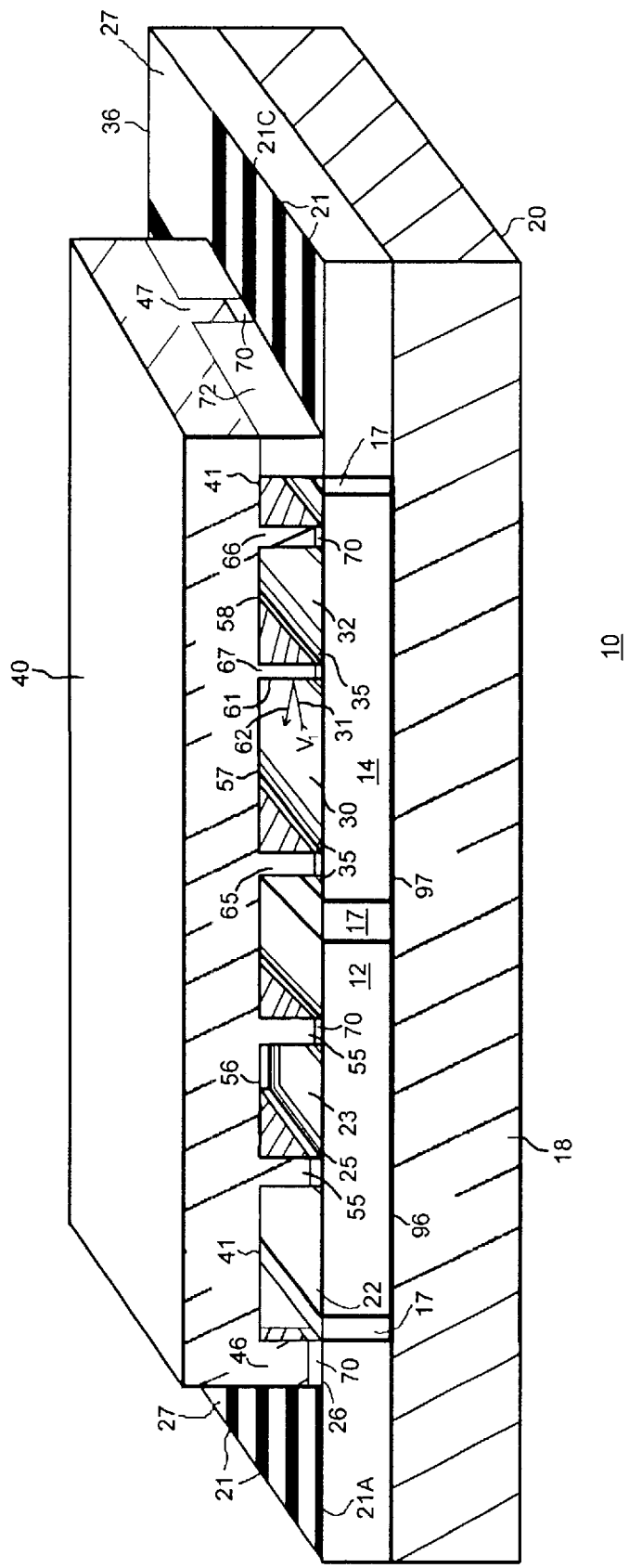
FIG. 3 shows a cross-sectional view of the integrated circuit after a second processing step.

Turning now to FIG. 3, a cross-sectional view of integrated circuit 10 is illustrated, showing semiconductor dice 12 and 14 separated by filler layer 17 and having surfaces 96 and 97, respectively, for mounting to package base 18 of integrated circuit package 20. Package lid 40 is attached to package base 18 and semiconductor dice 12 and 14, with projections 44, 46, 47, 55, and 65–67 attached to 34, 26, 49, 25, and 35, respectively, by using a conductive attachment material 70. Attachment material 70 preferably has a high conductivity in order to maintain contact regions 25, 34, 35, 26 and 49 at a uniform and stable potential, e.g., ground potential, which facilitates the layout of circuitry on semiconductor dice 12 and 14.

In one embodiment, attachment material 70 comprises a low temperature solder which is deposited on contact regions 25, 26, 34, 35, and 49, brought into contact with package lid 40 and then reflowed to form the attachment. Low temperature solder has a benefit of utilizing well developed semiconductor packaging technology, of not degrading the electrical properties of semiconductor dice 12 and 14, and of providing self alignment between package base 18 and package lid 40 by virtue of the surface tension resulting from the reflow step.

Alternatively, one or more of projections 44, 46, 47, 55, and 65–67 may be attached using a conductive epoxy or similar material to provide a reflective surface to incident electromagnetic waves, and therefore a shielding function. Attachment material 70 preferably has an elastic phase prior to final processing in order to accommodate any nonplanarity in the heights of semiconductor dice 12 and 14 and package base 18. A potential loading of circuit components can be substantially eliminated by forming projections 44, 46, 47, 55 and 65–67 so that they extend a distance of about two hundred fifty micrometers from surface 41 of package lid 40.

To appreciate the benefits of integrated circuit package 20, recall that oscillating signal $V_1$ is generated in region 30 as described above. Oscillating signal $V_1$ propagates from region 30 as an electromagnetic wave designated as ray 31 to a surface 61 of projection 67. Because of the high conductivity of the material used in the formation of package lid 40, ray 31 is reflected from surface 61 to form a reflected ray 62 which is similarly reflected when it propagates to another surface such as recessed surface 57. Hence, surfaces 57 and 61 along with the other surfaces surrounding region 30, form a shield that prevents, or at least substantially attenuates, the portion of in an electromagnetic wave which could otherwise be transmitted through projections 65 and 67 to reach other regions of integrated circuit 10.

The shielding effect of projections 55 and 65–67 attenuates oscillating signal $V_1$ to prevent it from propagating along an unforeseen feedback path to other circuitry that could cause a performance reduction or malfunction in the specified operation of integrated circuit 10. For example, if a significant portion of oscillating signal $V_1$ were to propagate to a node within region 23, a stage of the low noise amplifier formed in region 23 could be subjected to excessive noise, premature overload, or other undesirable performance degradation. Similarly, a propagation path for output signal $V_2$ from its origin in region 32 to region 23 could function as a feedback path that could result in an oscillation in region 23 or region 32. Such undesirable circuit behavior is virtually impossible to anticipate with current modeling tools and therefore is currently detectable only after integrated circuit 10 is to assembled. Hence, by shielding regions 23, 30 and 32 from impinging internal or external electromagnetic waves, projections 44, 46, 47, 55 and 65–67 can reduce or eliminate the need for a costly redesign step due to a degraded system performance that was not anticipated.

In certain applications, portions of integrated circuit package 20 could be made from materials having a low conductivity while still maintaining the shielding advantages. For example, a high permittivity or high permeability material can be used to provide a surface that is highly reflective to incident electromagnetic waves to provide an effective shielding function.

A seal is provided with a sealing material 72 disposed around the perimeter of package lid 40 as shown. In one embodiment, sealing material 72 comprises a standard non-conductive epoxy used in semiconductor packages.

Figure 2A:
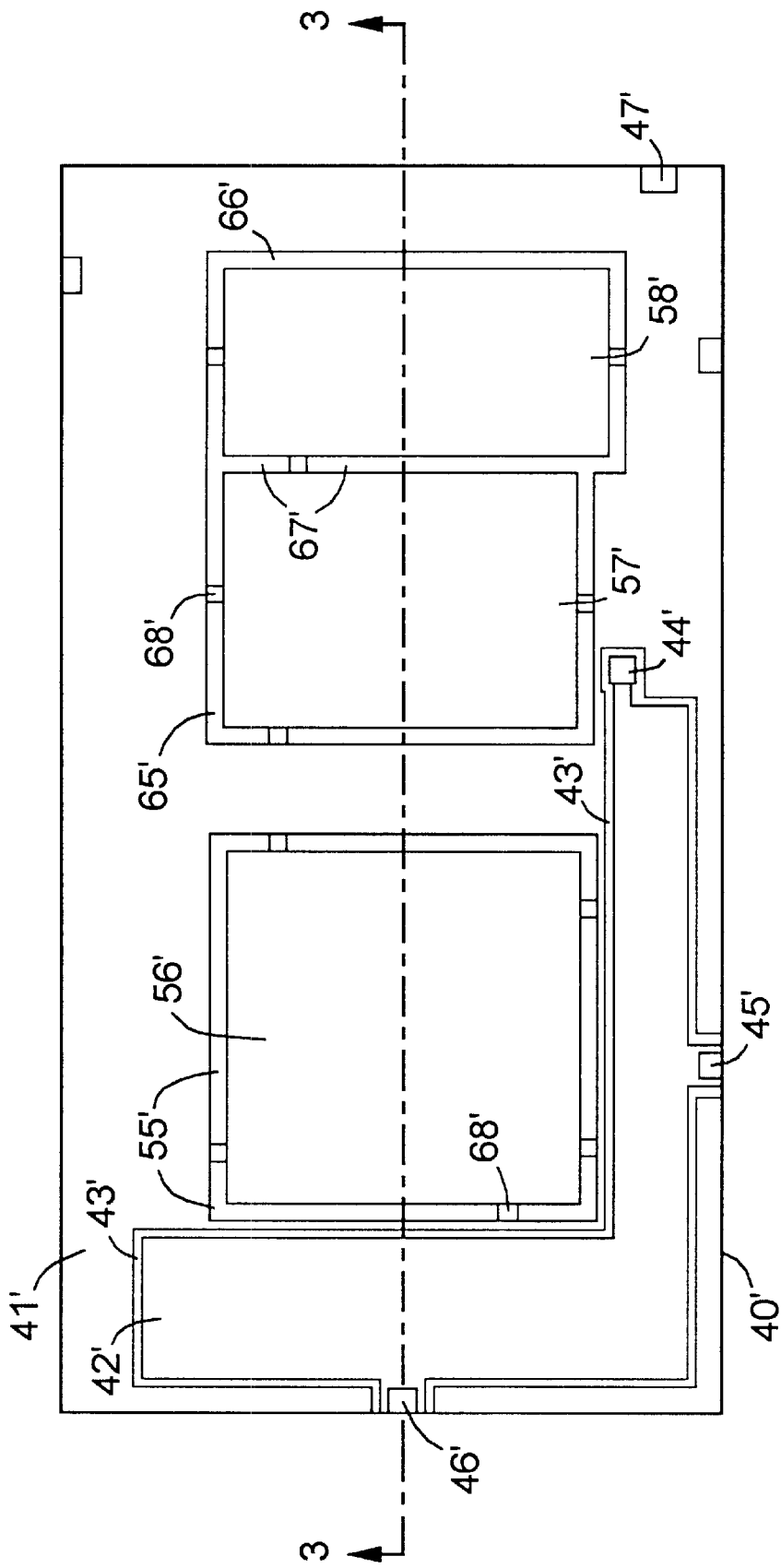
FIG. 2A shows a bottom view of a lid for another embodiment of a semiconductor package.

Turning now to FIG. 2A, another embodiment of a package lid 40' is illustrated, with similar numbers indicating similar components and a prime is added to each number to indicate the different embodiment. Package lid 40' has a first surface 41' that faces surfaces 22 and 24 of semiconductor dice 12 and 14 when package lid 40' is attached to package base 18 during assembly.

Projections 46' and 47' protrude from surface 41' for electrically and/or mechanically attaching to contact regions 26 and 49, respectively. In a similar fashion, projection 55' extends from surface 41' for attaching to contact region 25 and projections 65'–67' are formed to extend from surface 41' for attaching to contact region 35. Projections 55' and 65'–67' are respectively arranged on surface 41 so as to substantially enclose or surround circuit regions 23, 30 and 32 after assembly. Projections 55' and 65'–67' generally include small notches or gaps 68' which are positioned to align with gaps 29 and 39 in contact regions 25 and 35, respectively, to allow for leads to extend to one or more leads 21 and between circuits without contacting any of projections 55' and 65'–67'. In some embodiments, notches or gaps 68' may not be included because gaps 29 and 39 provide sufficient space (e.g. depth). Projections 55' and 65'–67' define or enclose interior surfaces 56'–58' in package lid 40'. At least interior surfaces 56'–58' of surface 41' are formed of, or coated with, an electrically conductive or shielding material. Projections 65'–67' combine with interior surfaces 57' and 58' which may be coplanar with surface 41', thereby forming reflecting shields that prevent rays 29, 31 and 33 from propagating to circuit region 23 or 23 other external circuitry, as described previously.

In addition, package lid 40' has a de-coupling capacitor formed on surface 41' in a generally L shape between projection 55' and the edge of package lid 40'. In this embodiment, the capacitor is formed by first depositing a layer 43' of dielectric material on the surface of conductive surface 41'. A high potential plate 42', or layer of conductive material, is then deposited on the surface of layer 43' so as not to contact any of surface 41'. Plate 42' operates as the high potential plate of the capacitor (with surface 41' at a common potential, such as ground) and as a power distribution conductor. In this specific embodiment, projections 44' and 45' are formed on dielectric layer 43' and in contact with conductive layer 42'. Projection 45' is positioned to electrically communicate with contact region 48 on lead 21B. Projection 44' is positioned to electrically communicate with contact region 34. Further, in this embodiment, lead 21B is designed to have a suitable voltage applied thereto for the operation of circuit 10. The voltage applied to lead 21B is conducted through plate 42' to projection 44' and thence to the oscillator by way of contact region 34. The capacitor can be formed sufficiently large to act as a decoupling capacitor for the power source to reduce noise, AC signals, etc. It will be understood that the capacitor illustrated is only one possible embodiment and many other types and shapes of capacitors, inductors, etc. can be easily incorporated into package lid 40'.

Figure 4:
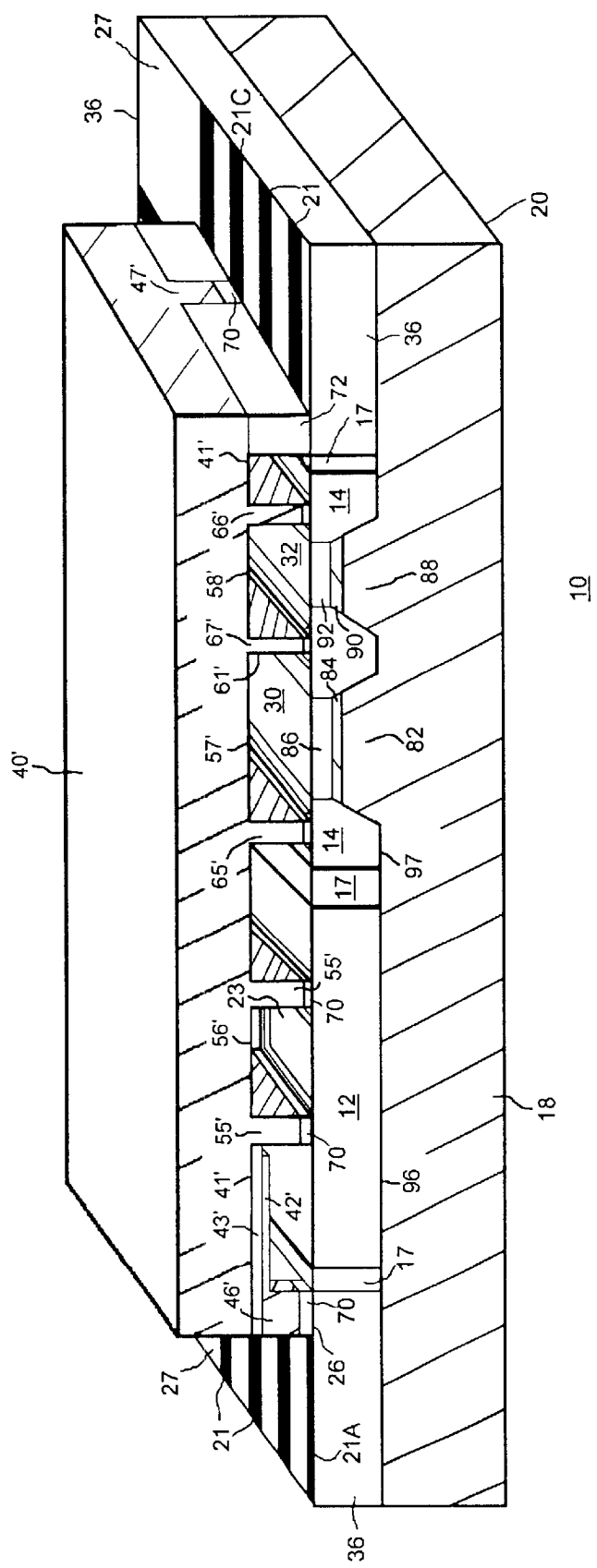
FIG. 4 shows a cross-sectional view of the integrated circuit in an alternate embodiment.

Turning now to FIG. 4 a cross-sectional view of integrated circuit 10 is illustrated with package lid 40' of FIG. 2A assembled with another embodiment of integrated circuit package 20 of FIG. 1. Dielectric layer 43' and high potential plate 42' are illustrated in the area adjacent projection 55'.

In this embodiment, regions 30 and 32 of semiconductor die 14 include low permittivity dielectric platforms 86 and 92, respectively, for forming passive components with low parasitic capacitances and/or inductances. For example, inductors generating variable magnetic fields can be formed on dielectric platforms 86 and 92. Dielectric platforms 86 and 92 are formed to a thickness of about thirty micrometers in accordance with a fabrication method disclosed in pending U.S. patent application Ser. No. 09/527,281, filed on Mar. 17, 2000 by the same inventor, Robert B. Davies, and entitled "Die Attachment and Method", which is incorporated herein by reference. Dielectric platforms 86 and 92 have an effective dielectric constant of about 2.5.

Semiconductor die 14 is etched from a bottom surface 97 to form recessed regions 84 and 90 under dielectric platforms 86 and 92, respectively. Recessed regions 84 and 90 virtually eliminate conductive portions of semiconductor die 14 which can support parasitic eddy currents induced by variable inductor currents. Hence, inductors and other passive components formed on dielectric platforms 86 and 92 have high quality factors. The etch occurs along crystallographic planes to form side surfaces of recessed regions 84 and 90 at a predictable angle of about 54.7 degrees from the bottom surface of semiconductor die 14.

Package base 18 is formed with raised pedestals 82 and 88 having side surfaces formed at a predictable angle of about 54.7 degrees to align with the side surfaces of recessed regions 84 and 90, respectively. In this embodiment, the height of pedestals 82 and 88 is selected to leave air gaps between pedestals 82 and 88 and dielectric platforms 86 and 92, respectively, as shown. The air gaps increase the distance between the passive components and the conductive materials used to form package base 18, thereby reducing undesirable parasitic effects. As a result, the quality factor of the passive components formed on dielectric platforms 86 and 92 is further increased while providing shielded environments for circuit regions 30 and 32.

Perimeter ring 36 is sized to accommodate semiconductor dice 12 and 14 and attached to package base 18 with a die attach material such as an epoxy, or the like.

Figure 5:
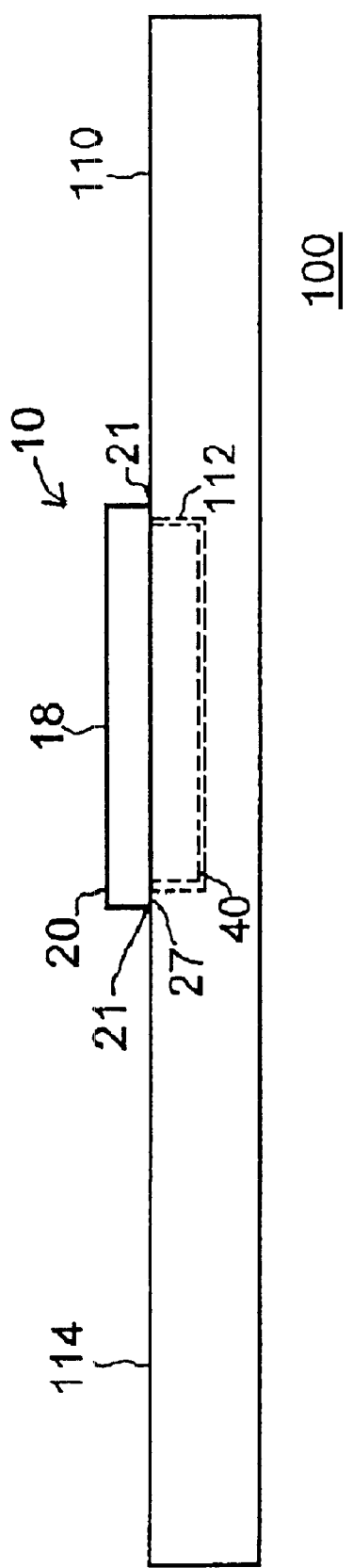
FIG. 5 is a side view of an electrical system showing the integrated circuit mounted on a motherboard.

Referring additionally to FIG. 5, a side view of an electrical system 100 is illustrated including integrated circuit 10 mounted on a motherboard 110. A recessed region 112 is milled or similarly formed in motherboard 110 to a size that accommodates the dimensions of package lid 40 or 40' as shown. Hence, package lid 40 or 40' is hidden while package base 18 extends above a surface 114 of motherboard 110 as shown. Surface 27 of package base 18 is mounted against a surface 114 of motherboard 110 so that leads 21 can be electrically and mechanically attached to circuit traces formed on surface 114 in a "flip-chip" fashion to provide a low profile for semiconductor package 20.

By now it should be appreciated that the present invention provides a semiconductor device and an isolation method for an integrated circuit. A semiconductor die has a top surface formed with first and second circuit regions. The semiconductor die is housed in a package whose lid is formed with a projection for electrically contacting the first surface of the semiconductor die. The projection forms a shield around the first region which prevents electromagnetic waves generated in the second region from propagating to the first region. The projections also isolate the regions by providing a stable and constant reference potential, e.g., ground potential. Such a stable potential prevents signals generated in the second region from affecting the behavior of circuitry in the first region via a ground loop caused by an excessive ground impedance. Moreover, the projections can be attached to the semiconductor package base provided the leads are substantially coplanar with the top surface of the semiconductor die. The integrated circuit typically is mounted in a "flip-chip" fashion to a motherboard with the package lid being disposed in a recessed region milled in the motherboard.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A semiconductor device, comprising:
   a semiconductor die having first and second circuit regions formed on a first surface; and
   a semiconductor package for housing the semiconductor die, the semiconductor package including a lid formed with a projection and electrically conductive material, said projection physically contacting the semiconductor die, the projection electrically shielding the first circuit region from the second circuit region.

2. The semiconductor device of claim 1, wherein the semiconductor package further includes a package base for mounting to a second surface of the semiconductor die.

3. The semiconductor device of claim 2, wherein the package base has a region formed for electrically contacting the lid.

4. The semiconductor device of claim 1, wherein the projection of the lid includes a conductive material.

5. The semiconductor device of claim 1, wherein the projection electrically contacts the first surface of the semiconductor die in a contact region lying between the first and second circuit regions.

6. The semiconductor device of claim 5, wherein the projection encircles a conductive portion on the lid.

7. The semiconductor device of claim 6, wherein the projection surrounds the first circuit region.

8. The semiconductor device of claim 7, wherein the projection surrounds the second circuit region.

9. The semiconductor device of claim 1 further including a capacitor formed on a surface of the lid.

10. The semiconductor device of claim 9 wherein the lid includes a conductive area and the capacitor includes a dielectric layer positioned on the conductive area of the lid and a conductive layer positioned on the dielectric layer.

11. The semiconductor device of claim 1, wherein the projection defines a recessed surface of the lid that overlies the first region of the semiconductor die.

12. An integrated circuit, comprising:
    a first semiconductor die having a first surface for forming a first circuit component;
    a second semiconductor die having a first surface for forming a second circuit component; and
    an integrated circuit package having a lid formed with a projection, said projection physically and electrically contacting the first surface of the first semiconductor die to electrically isolate the first circuit component from the second circuit component.

13. The integrated circuit of claim 12, wherein the integrated circuit package includes a package base for mounting to a second surface of the first semiconductor die.

14. The integrated circuit of claim 13, wherein the second semiconductor die has a second surface for mounting to the package base.

15. The integrated circuit of claim 12, wherein the projection electrically contacts the first semiconductor die at a contact region formed on the first surface of the first semiconductor die between the first and second circuit components.

16. The integrated circuit of claim 15, wherein the contact region is configured for biasing to a substantially constant potential.

17. The integrated circuit of claim 16, wherein a signal generated by the first circuit component, that radiates in a direction of the second, circuit component, is reflected by the projection.

18. A method of electrically isolating a region of a semiconductor die, comprising the steps of:
    providing a semiconductor package for housing the semiconductor die;
    generating a radiating signal with a circuit component of the semiconductor die; and
    shielding the radiating signal with a projection formed in a lid of the semiconductor package; said projection of said lid physically contacting the semiconductor die.

19. The method of claim 18, further including the step of biasing the projection to a substantially constant potential.

20. A method of making an integrated circuit, comprising the steps of:
    mounting a first surface of a semiconductor die to a package base of a semiconductor package; and
    enclosing the semiconductor die with a lid of the semiconductor package, where the lid is formed with a projection for physically and electrically contacting a second surface of the semiconductor die.

21. The method of claim 20, further comprising the step of forming a circuit region on the second surface of the semiconductor die.

22. The method of claim 21, further comprising the step of generating a signal with the integrated circuit.

23. The method of claim 22, wherein the step of generating includes the step of generating the signal at a location of the integrated circuit to radiate toward the circuit region.

24. The method of claim 23, further comprising the step of reflecting the signal with the projection to produce a reflected signal in a direction away from the circuit region.

25. The method of claim 20, wherein the step of enclosing includes the steps of:

forming a contact region on the second surface of the semiconductor die; and attaching the projection to the contact region.

26. The method of claim 25, wherein the step of attaching includes the step of reflowing solder to electrically contact the projection to the contact region.

27. The method of claim 20 including in addition a step of forming a capacitor in the lid of the semiconductor package.

28. The method of claim 27 wherein the step of forming the capacitor includes providing a conductive area in the lid, depositing a layer of dielectric material on the conductive area, depositing a layer of conductive material on the layer of dielectric material, and coupling the layer of conductive material to the semiconductor die.

29. A method of using an integrated circuit, comprising the steps of:

providing a semiconductor die;

providing a semiconductor package and housing the semiconductor die in the semiconductor package, the semiconductor package including a lid formed to provide electrical shielding for the semiconductor die, said projection physically contacting the semiconductor die, the lid including a conductive area, and a capacitor including a dielectric layer positioned on the conductive area of the lid and a conductive layer positioned on the dielectric layer, the conductive layer having a plurality of electrical contacts; and positioning a first of the electrical contacts for coupling to a power source and coupling remaining electrical contacts to power input terminals on the semiconductor die, for using the conductive layer to distribute power to different points on the semiconductor die.

30. A method as claimed in claim 29 wherein the lid further includes a plurality of capacitors each including a dielectric layer positioned on the conductive area of the lid and a conductive layer positioned on the dielectric layer, each of the conductive layers of the plurality of capacitors having a plurality of electrical contacts for coupling to different power potential sources and coupling the different power potential sources to different points on the semiconductor die.

31. A method as claimed in claim 30 wherein each of the plurality of capacitors is designed to operate as a decoupling capacitor for the different power potential sources.

* * * * *